(12) United States Patent
Xu et al.

(10) Patent No.: US 9,118,295 B2
(45) Date of Patent: Aug. 25, 2015

(54) SYSTEMS AND METHODS FOR ADAPTIVE EQUALIZATION CONTROL FOR HIGH-SPEED WIRELINE COMMUNICATIONS

(75) Inventors: ChangXi Xu, Shanghai (CN); Ray Lin, Shanghai (CN); Hui Wang, Shanghai (CN)

(73) Assignee: INTEGRATED DEVICE TECHNOLOGY, INC., San Jose, CA (US)

(*) Notice: Subject to any disclaimer, the term of this patent is extended or adjusted under 35 U.S.C. 154(b) by 235 days.

(21) Appl. No.: 13/420,935

(22) Filed: Mar. 15, 2012

(65) Prior Publication Data

US 2013/0241643 A1 Sep. 19, 2013

(51) Int. Cl.
*H04B 1/10* (2006.01)
*H03G 3/30* (2006.01)

(52) U.S. Cl.
CPC ........... *H03G 3/3052* (2013.01); *H03G 3/3078* (2013.01); *H04B 1/10* (2013.01)

(58) Field of Classification Search
CPC ...................................................... H04B 1/10
USPC .......... 375/316, 346, 348, 229, 230, 232, 233
See application file for complete search history.

(56) References Cited

U.S. PATENT DOCUMENTS

| | | | |
|---|---|---|---|
| 3,792,356 A * | 2/1974 | Kobayashi et al. | ........... 375/232 |
| 6,169,764 B1 | 1/2001 | Babanezhad | |
| 6,819,166 B1 | 11/2004 | Choi et al. | |
| 6,961,370 B2 * | 11/2005 | Chappell | ........................ 375/224 |
| 6,975,678 B1 * | 12/2005 | Le et al. | ........................ 375/232 |
| 7,778,323 B1 * | 8/2010 | Nodenot et al. | ............. 375/233 |
| 8,081,031 B2 | 12/2011 | Bi | |
| 2010/0142606 A1 * | 6/2010 | Kato | ............................. 375/232 |
| 2010/0188275 A1 * | 7/2010 | Kaihara et al. | ................ 341/132 |

OTHER PUBLICATIONS

J.-S. Choi et al., "A 0.18μm CMOS 3.5-Gb/s Continuous-Time Adaptive Cable Equalizer Using Enhanced Low-Frequency Gain Control Method," JSSCC2004, pp. 419-425, Mar. 2004.
G. Zhang et al., "A 10Gb/s BiCMOS adaptive cable equalizer", JSSCC 2005, vol. 40, No. 11, pp. 2132-2140, Nov. 2005.
S. Gondi et al, "Equalization and Clock and Data Recovery Techniques for 10-Gb/s CMOS Serial-Link Receivers", JSSCC 2007, vol. 42, No. 9, pp. 1999-2011, Sep. 2007.
W. Wong et al, "Digitally Assisted Adaptive Equalizer in 90 nm With Wide Range Support From 2.5 Gbps to 6.5 Gbps", Altera, DesignCon 2007, Apr. 2007.

* cited by examiner

*Primary Examiner* — Kevin M Burd
(74) *Attorney, Agent, or Firm* — Haynes and Boone LLP

(57) ABSTRACT

Methods and systems for conditioning wireline communications to remove intersymbol interference are provided that used adaptive equalization. The method and systems include using a digital finite state machine to control two feedback loops that adjust the gain and power of the input signal relative to a supplied reference. The eye height of the input signal is conditioned by a gain feedback loop so that signal equalization can be performed in a known state. The digital finite state machine allows the loops to be flexibly run in sequence or concurrently. The adaptation functions can be shut off when adequate signal equalization has been achieve, thus saving power.

23 Claims, 11 Drawing Sheets

SYSTEMS AND METHODS FOR ADAPTIVE EQUALIZATION CONTROL FOR HIGH-SPEED WIRELINE COMMUNICATIONS

BACKGROUND

1. Technical Field

The present disclosure relates to the field of signal conditioning in high-speed wireline communications. More specifically, the present disclosure relates to systems and methods for using adaptive equalization control to condition signals for high-speed wireline communications.

2. Discussion of Related Art

Whenever electrical signals are transmitted over wires, the integrity of the signal can be degraded. The signal that was originally placed on the wire will have some differences from the signal that is received at the other end of the wire. This is due to inherent physical properties of the wire.

In a digital signal, the frequency components of a bit of data can spread apart as the higher and lower frequency components travel at slightly different rates through the wireline. This can cause intersymbol interference (ISI) in which one bit can interfere with the preceding and subsequent bits. In recent years, as data has been required to travel with higher data rates over longer distances of wirelines, the problems of maintaining signal integrity and minimizing ISI have increased.

Several techniques have been developed to deal with ISI. Some of these techniques include, for example, error correction coding, separating signals in time, and using an equalizer. Equalizers can be used in an effort to correct for the distortions caused by the non-uniform frequency response of the wireline. However, the equalizers that have been developed to date have not been satisfactory in every respect.

SUMMARY

Embodiments of a receiver are provided herein for facilitating adaptive equalization control. The receiver includes a variable gain amplifier configured to receive an input signal at a signal input, an equalizer peaking amplifier coupled to an output of the variable gain amplifier, a regulated amplifier coupled to an output of the equalizer peaking amplifier; and an adaptation block coupled to the variable gain amplifier, the equalizer peaking amplifier, and the regulated amplifier.

Embodiments of a method for conditioning transmissions in a high-speed wireline communications are also provided. Such a method may include receiving an input signal at a voltage gain amplifier, providing a reference voltage level. The method may include steps of controlling a voltage gain amplifier with a digital finite state machine, the digital finite state machine controlling the voltage gain amplifier based at least in part on the reference voltage level, and the voltage gain amplifier modifying the input signal; and controlling an equalizer peaking amplifier with a digital finite state machine, the digital finite state machine controlling the equalizer peaking amplifier based at least in part on the reference voltage level, the equalizer peaking amplifier modifying the input signal. In the method, controlling the voltage gain amplifier and controlling the equalizer peaking amplifier are performed to equalize the input signal.

Additionally, embodiments of another method for conditioning transmissions in a high-speed wireline communications are provided. The embodiments may include receiving an input signal at a voltage gain amplifier, controlling the voltage gain amplifier so as to condition an eye height of the input signal to match a reference level, and tuning an equalizer peaking amplifier to control equalizer peaking of the input signal after the input signal has been matched to the reference level.

These and other embodiments will be described in further detail below with respect to the following figures.

Figure 1:
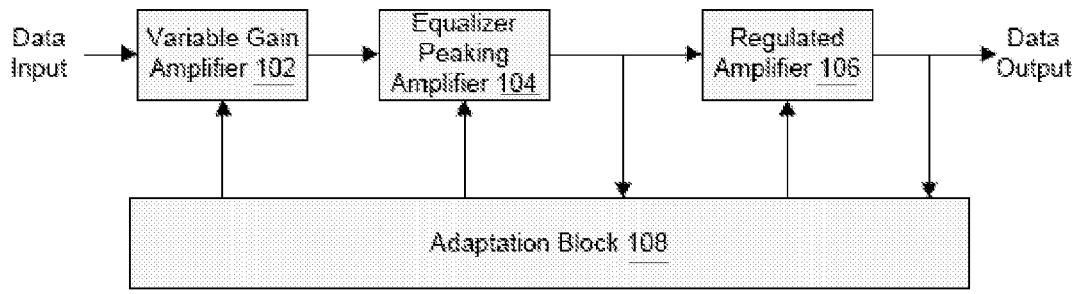
FIG. 1 illustrates a system for facilitating adaptive equalization control at a wireline receiver.

In the drawings, elements having the same designation have the same or similar functions.

DETAILED DESCRIPTION

FIG. 1 shows a diagram of an adaptively equalized receiver 100 for conditioning high-speed wireline communication signals according to some embodiments of the present invention. Receiver 100 includes a variable gain amplifier 102 that may be configured to receive a data input from a high-speed wireline, for example a Universal Serial Bus (USB) connection or other high speed connection. The output signal from variable gain amplifier 102 may be coupled to an equalizer peaking amplifier 104. The output signal from equalizer peaking amplifier 104 may be coupled to a regulated amplifier 106. Regulated amplifier 106 may have an output signal that is routed to particular destinations.

FIG. 1 also depicts an adaptation block 108. Adaptation block 108 may be coupled to receive signals from equalizer peaking amplifier 104 and the data output of regulated amplifier 106. Adaptation block 108 may also be coupled to transmit control signals to variable gain amplifier 102, equalizer peaking amplifier 104, and regulated amplifier 106. While FIG. 1 depicts the signal path as showing variable gain amplifier 102 first, equalizer peaking amplifier 104 second, and regulated amplifier 106 third in the data path, the blocks may be arranged in any order without departing from the scope of the invention.

In operation, embodiments of receiver 100 as depicted in FIG. 1 may receive an incoming high-speed communications signal at the input of variable gain amplifier 102. As indicated, application block 108 may be coupled to variable gain amplifier 102 so that application block 108 may send a signal to adjust the gain of variable gain amplifier 102. This adjustment may be based on a feedback control loop that includes a generated reference signal. The output of the variable gain amplifier 102 may be adjusted by equalizer peaking amplifier 104 so as to substantially restore the original frequency components of the signal to that of the originally sent signal. As such, Equalizing peaking amplifier 104 may include a series of one or more individual peaking amplifiers such as that described in U.S. Pat. No. 8,081,031 to Han Bi, issued on Dec. 20, 2011, which is herein incorporated by reference in its entirety. Each of the equalizing peak amplifiers may amplify different ranges of signal frequencies.

As shown in the embodiment of FIG. 1, equalizer peaking amplifier 104 receives control signals from adaption block 108. The control signals from adaption block 108 may be adapted to control the amplification provided by each of the serially coupled peak amplifiers. Therefore, based on the control signal from adaptation block 108, equalizer peaking amplifier 104 may adjust the frequency response correction applied to data input signal. The adjustments made to equalizer peaking amplifier 104 may be based on all frequencies contained in the received data signals, and not on a subset of signal frequencies. The adjustment may be based on a feedback loop which includes the output of regulated amplifier 106.

Figure 2:
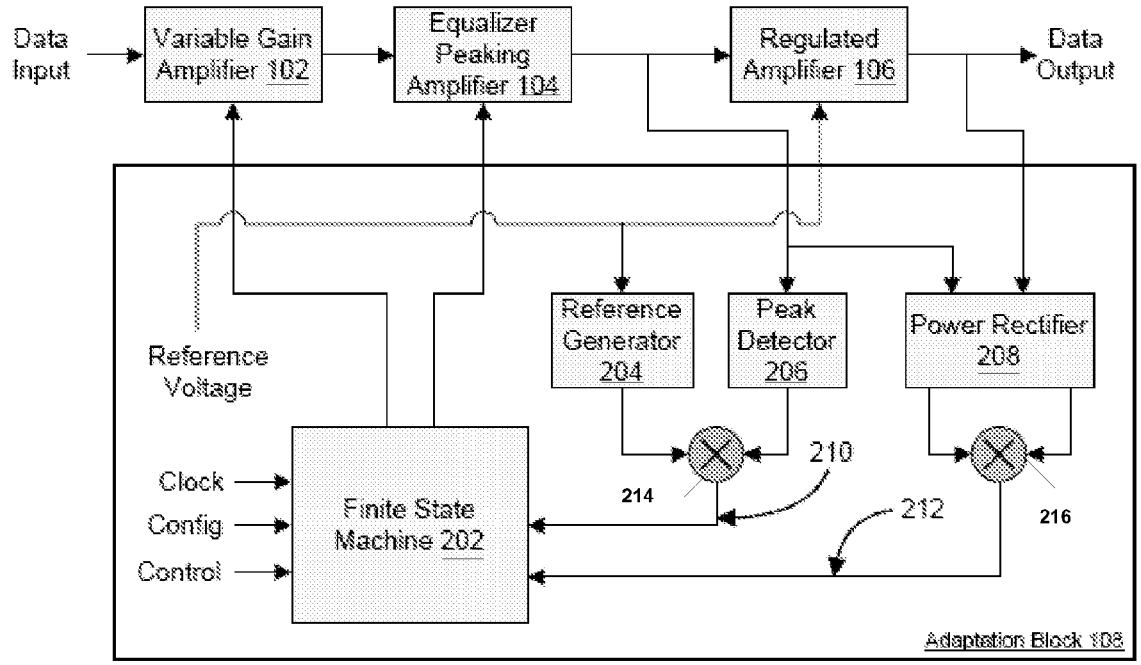
FIG. 2 illustrates a receiver for facilitating adaptive equalization control at a wireline receiver depicting more detail of the adaptation block.

FIG. 2 depicts an embodiment of adaptively equalized receiver 100, which in some embodiments improves signal integrity in high-speed wireline communications. As shown in FIG. 2 variable gain amplifier 102 is coupled to receive the data input signal, an equalizer peaking amplifier 104 is coupled to receive the signal from amplifier 102, and a regulated amplifier 106 is coupled to receive the signal from equalizer peak amplifier 104. Each of variable gain amplifier 102, equalizer peaking amplifier 104, and regulated amplifier 106 may be coupled to receive control signals from adaptation block 108.

As shown in FIG. 2, adaptive block 108 includes a digital finite state machine (FSM) 202. FSM 202 may be configured to receive differential error control signals and to output control signals to variable gain amplifier 102, equalizer peaking amplifier 104, and regulated amplifier 106. FSM 202 may output a gain control signal to variable gain amplifier 102, the gain control signal may adjust, by an increase or decrease, the gain applied by variable gain amplifier 102 to the data input signal. The gain of variable gain amplifier 102 may be increased or decreased to cause an eye height of the data input signal to be within a desired range or at a desired level. As is well known, an eye pattern or eye diagram is a diagram of a data transmission signal formed on an oscilloscope display where the digital signal is applied to the vertical input and the data rate triggers the horizontal sweep. The variable gain amplifier 102 may thereby control the low frequency swing of the data input signal by adjusting the eye height of the data input signal.

FSM 202 may also output a peaking control signal to equalizer peaking amplifier 104. The peaking control signal may adjust the amplification of certain frequency ranges present in the input signal. This can, for example, be accomplished by adjusting individual peak amplifiers that are serially coupled in equalizer peak amplifier 104. Thus, the equalizer peaking amplifier may adjust components in particular frequency ranges, for example the high frequency components of the data input signal.

As illustrated in FIG. 2, a reference voltage is input to a reference generator 204. Further, the output signal from equalizer peaking amplifier 104 is input to peak detector 206. Reference generator 204 generates reference peak levels while peak detector 206 determines the peak levels of the signal from equalizing peak amplifier 104. A peak level error signal 210 is determined by convoluting the signals from reference generator 204 and peak detector 206 in combiner 214. The peak level error signal 210 is then input to finite state machine 202. In some embodiments, peak level error signal 210 includes a digital up or down signal, instructing FSM 202 to increase or decrease gain.

As is further shown, the output signal from equalizer peaking amplifier 104 and the data output signal are input to power rectifier 208. Power rectifier 208 rectifies those signals to determine the average power of the signal from equalizer peaking amplifier 104 and the data output signal. Those two signals are convoluted in combiner 214 to generate a peaking error signal 212. Peaking error signal 212 may also be a digital up or down signal indicating to FSM 202 either to increase or decrease the overall gain of variable gain amplifier 102 and equalizer peaking amplifier 104.

As indicated above, FSM 202 receives the peak level error signal 210 and the power output error signal 212 and determines the gain and peaking control signals to variable gain amplifier 102 and equalizer peaking amplifier 104. FSM 202 may produce the control signals as part of two feedback loops. In a gain control loop, the signal output from variable gain amplifier 102 may be received and altered by equalizer peaking amplifier 104. The resulting equalized signal may be routed to a peak detector 204. Peak detector 204 may be configured to compare the eye height of the equalized signal with the level of a reference signal.

Therefore, as illustrated in FIG. 2, receiver 100 includes an automatic peak boosting loop and an automatic gain control. In this control loop, after the equalized signal leaves equalizer peaking amplifier 104 it may be received at the input of regulated amplifier 106. Regulated amplifier 106 may also receive the same reference voltage that is applied to reference generator 204 in the automatic gain control loop. The reference voltage may cause the output of regulated amplifier 106 to have the same swing value as the output of reference generator 206. The output of regulated amplifier 106 may be the data output of system 100. Additionally, the output of regulated amplifier 106, the regulated signal, may be sent to power rectifier 208, which may also receive the equalized signal from the output of equalizer peaking amplifier 104. Power rectifier 208 may detect a power difference between the equalized signal and the regulated signal. In some embodiments power rectifier 208 may include two separate power rectifiers, one for each of the two signals. The power difference from combiner 216 may be sent on as a peaking error signal. The peaking error signal may be quantized before transmission to FSM 202. FSM 202 may use the peaking error signal to determine a peaking control signal, which is then sent to equalizer peaking amplifier 104. The peaking control signal may cause equalizer peaking amplifier 104 to adjust so as to control the power of the output signal from regulated amplifier 106. This may be accomplished by selectively increasing or decreasing the magnitude of certain frequency components in the signal. This may complete the automatic peak boosting loop.

In both of the above-described loops, FSM 202 may use one of several locking algorithms in communicating with the variable gain amplifier 102 and the equalizer peaking amplifier 104. FSM 202 may use a locking algorithm to ensure proper communication with variable gain amplifier 102 and equalizer peaking amplifier 104. In some embodiments, the gain control signal and the peaking control signal may be multi-bit (e.g., 3 bit) signals, or may be a series of multi-bit signals. In some embodiments, the automatic gain control loop (the AGC loop) may operate first, while the automatic peak boosting loop (the boost loop) may operate second. In other embodiments, both the AGC loop and the boost loop may operate concurrently.

As indicated, adaptation block 108 may include a reference voltage. Additionally, the adaptation block may include a clock signal, a configuration signal, and a control signal. These three signals may be included as inputs to FSM 202. In some embodiments, the clock, configuration, and control signals may be the same for the AGC loop and the boost loop. In other embodiments, the clock, configuration, and control signals may be programmable independently for the automatic gain control and automatic peak boosting loops. This may allow greater flexibility to optimize performance of each control loop.

When the eye height of the corrected signal matches that produced by reference generator 204 and the equalized signal power matches the regulated signal power, adaptation block 108 may turn off to decrease the power consumption of the adaptive equalization system. However, the gain control and peaking control signals may be maintained even when adaptation block 108 is shut off.

Figure 3:
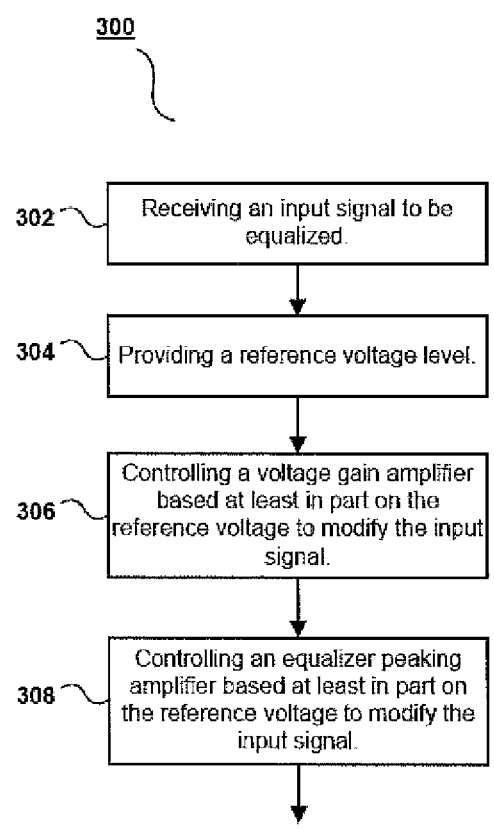
FIG. 3 illustrates a flowchart illustrating a method for conditioning high-speed wireline signals by using adaptive equalization.

FIG. 3 depicts a flowchart for a method 300 for conditioning signals transmitted in high-speed wireline communications systems by using adaptive equalization control. Method 300 may be implemented using an adaptive equalization system such as system 100 as described above. Those systems will be used herein to provide details regarding the operation of method 300. However, method 300 should not be understood as limited to implementation in those particular systems.

Method 300 may begin in step 302, when the system receives an input signal that may need equalization due to channel-loss introduced intersymbol interference. Step 304 includes providing a reference voltage to the system. Steps 306 and 308 may be performed by finite state machine 202. So, in step 306, the receiver 100 may control a voltage gain amplifier using finite state machine 202. Finite state machine 202 may exert control based in part on the provided reference voltage to modify the eye height of the input signal received by the system. In step 308, the system may control an equalizer peaking amplifier based in part on the reference voltage to modify the power of the input signal. The system may control the equalizer peaking amplifier with the same finite state machine as used in step 308.

Using receiver 100 as a non-limiting example, method 300 may begin when a voltage gain amplifier 102 receives an input signal at its input (step 302). The input signal may exhibit a degree of intersymbol interference to be corrected. Adaptation block 108 may be provided with a reference voltage (step 304). The reference voltage may be coupled to a reference generator 204 that may generate a reference signal. The reference voltage may also be coupled to a regulated amplifier 106 to regulate its output swing.

Adaptation block 108 may exert control of voltage gain amplifier 102. This may be accomplished through adjustments to an automatic gain control loop. The loop may begin at the output of voltage gain amplifier 102 which may be routed through an equalizer peaking amplifier 104, producing an equalized signal. A peak detector 206 may detect the difference between an eye height of the equalized signal and the reference voltage.

The difference may be quantized to produce a gain error signal that can be transmitted to an FSM 202. FSM 202 may determine an appropriate gain control signal to transmit to variable gain amplifier 102, based on the gain error signal (step 306).

System 100 may also exert control of equalizer peaking amplifier 104. This may be accomplished through adjustments to an automatic peak boosting loop. The loop may begin at the output of equalizer peaking amplifier 104 with the equalized signal. The equalized signal may be routed to a regulated amplifier 106 and a power rectifier 208. The output of regulated amplifier 106 may also be routed to power rectifier 208, where power rectifier 208 may detect a difference between the regulated and the equalized signals. The difference is quantized and provided to the FSM 202. FSM 202 may then use the quantized difference to determine a peaking control signal, which FSM 202 may transmit to equalizer peaking amplifier 104. Equalizer peaking amplifier 104 may be adjusted by the peaking control signal to minimize the power difference between the equalized and regulated signals (step 308).

Figure 4:
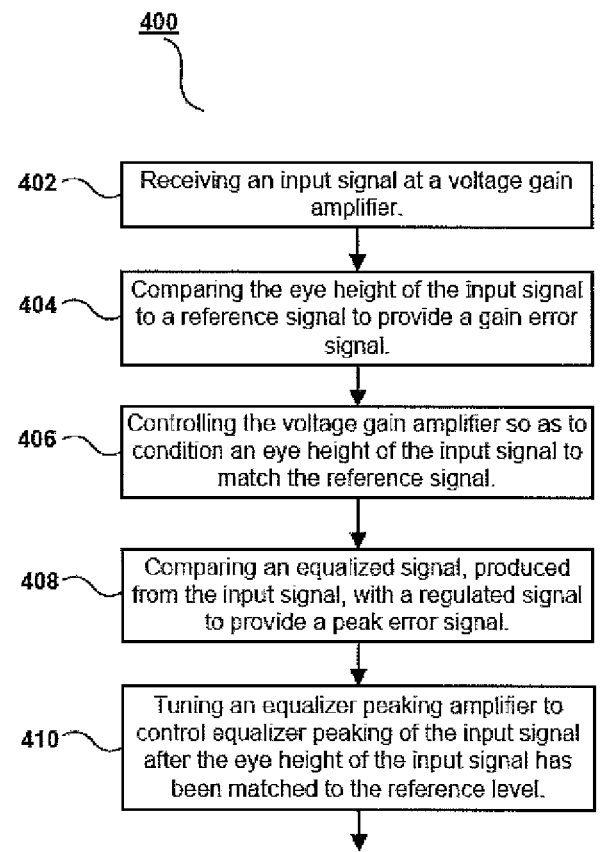
FIG. 4 illustrates a flowchart illustrating an additional method for conditioning high-speed wireline signals by using adaptive equalization.

FIG. 4 depicts a flowchart of a method 400 for conditioning signals transmitted in high-speed wireline communications systems by using adaptive equalization control. As was the case for FIG. 3, method 400 may be implemented using an adaptive equalization system such as in receiver 100, as described above. While those systems may be used to provide details regarding the operation of method 400, the explanatory use of system 100 herein should not be understood as limiting method 400 to any particular system.

Method 400 may begin in step 402, when an adaptive equalization system receives an input signal at a voltage gain amplifier. In step 404, a peak detector may compare an eye height of the input signal to a generated reference signal. The difference between the two signals may be to create a gain error signal. The gain error signal may be used to provide feedback to the voltage gain amplifier. The system may adjust the voltage gain amplifier so that the eye height of the input signal matches the generated reference signal, in step 406.

Method 400 may continue in step 408, when a power rectifier may detect a power difference between an equalized signal with a regulated signal. The difference between the equalized signal and the regulated signal may be used to create a peaking error signal. The peaking error signal may be used by the system to provide feedback to an equalizer peaking amplifier. The equalizer peaking amplifier 104 may be tuned so that the power of the equalized signal matches the power of the regulated signal, in step 410. The tuning of the equalizer peaking amplifier may be performed after the eye height of the input signal has been matched to the reference level.

Using adaptive equalization system 100 as an example, method 400 may begin when an input signal transmitted over a high-speed wireline is received by a voltage gain amplifier 102 (Step 402). The signal may be altered and transmitted to an equalizer peaking amplifier 104. After the signal has passed through equalizer peaking amplifier 104 it may be transmitted to a peak detector 206. Peak detector 206 may compare the eye height of the input signal to a reference signal generated from a reference voltage by a reference generator 204. The comparison performed by peak detector 206 may provide a gain error signal. In some embodiments, the gain error signal may be quantized and transmitted to a digital finite state machine, such as FSM 202. The gain error signal may be used to produce a gain control signal. In turn, the gain control signal may be transmitted to variable gain amplifier 102 and may adjust it so that the eye height of the input signal matches the generated reference signal (Step 406).

The output of equalizer peaking amplifier 104 may also be routed to a power rectifier 208. Power rectifier 208 may also receive the output of a regulated amplifier 106. Power rectifier 208 may compare the power of the equalized signal with the power of the regulated signal to determine a power difference (Step 408). This power difference may serve as a peaking error signal (Step 408). The peaking error signal may, in some embodiments, then be quantized and transmitted to FSM 202. FSM 202 may generate a peaking control signal from the peaking error signal. The peaking control signal may be transmitted to equalizer peaking amplifier 104. Equalizer peaking amplifier 104 may respond by adjusting so that the power of the equalized signal matches the power of the regulated signal (Step 410).

After equalizer peaking amplifier 104 has been properly tuned, the eye height of the input signal will match the reference level, and the power of the equalized and regulated signals will match as well. In these conditions, adaptation block 108 as seen in FIGS. 1 and 2 may shut off to conserve power. In such an instance, the gain control and peaking control signals may be maintained so that the state of adaptive equalization system continues to equalize the input signal. In those embodiments of method 400 that include quantizing and transmission to FSM 202, the gain and peaking control signals may be digital signals of multiple-bit word lengths transmitted in parallel, or a series thereof.

Figure 5A:
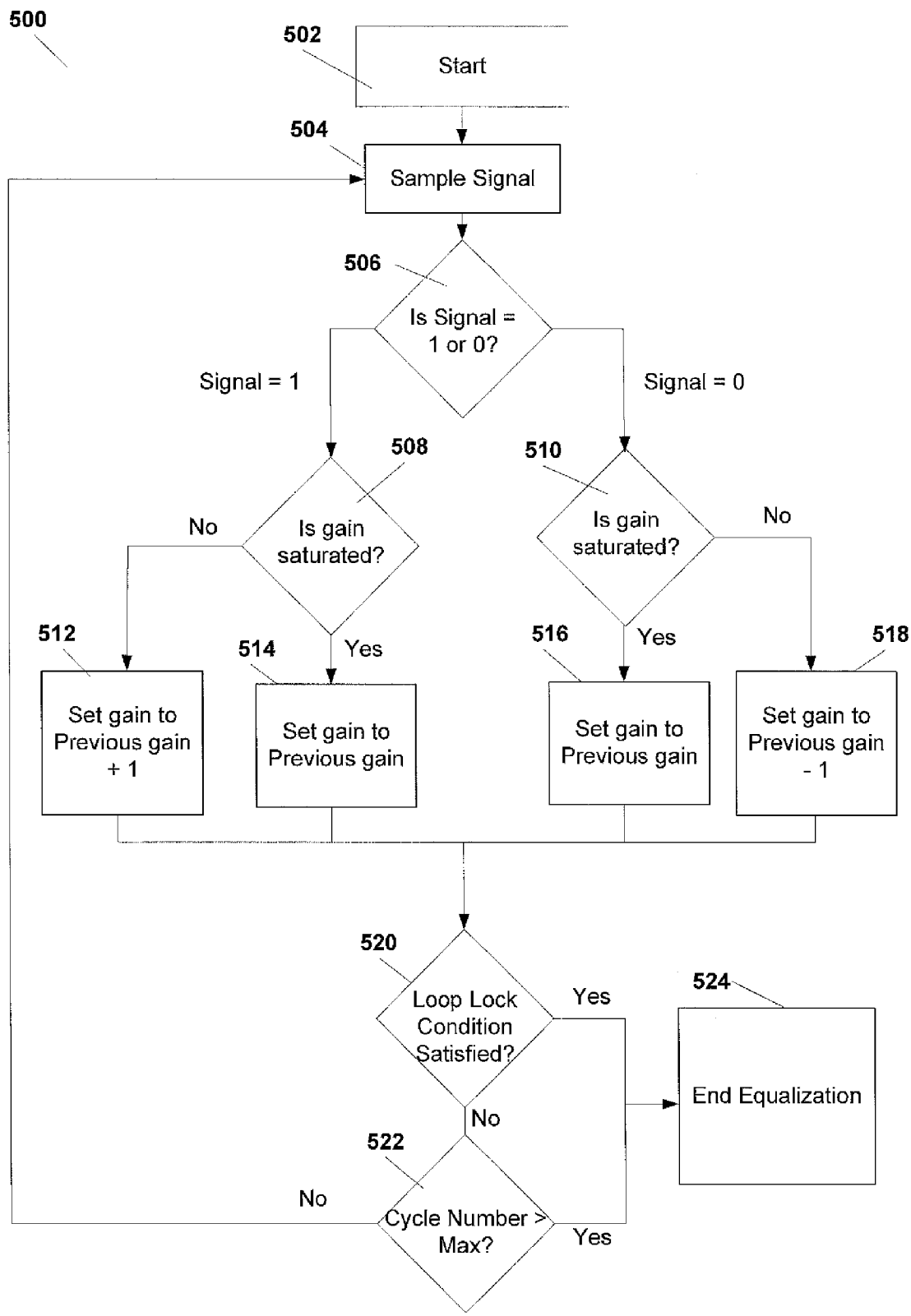
FIGS. 5A and 5B illustrate an embodiment of a Finite State Machine that can be utilized in the receiver of FIG. 2.
Figure 5B:
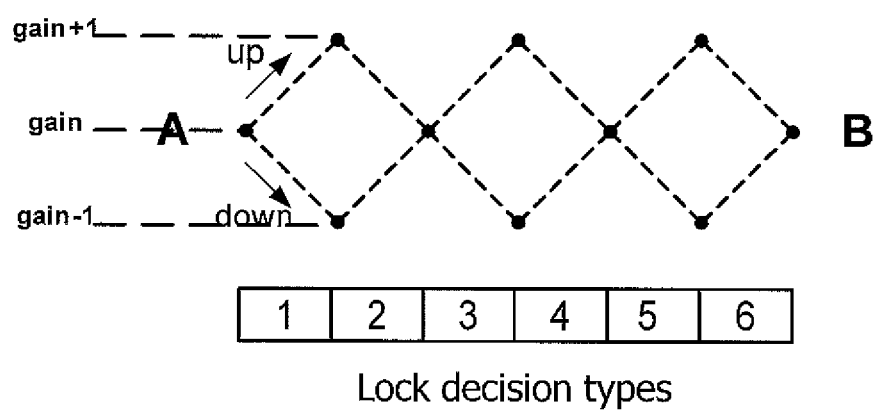

FIGS. 5A and 5B illustrate an embodiment of a loop that is operated by FSM 202. In general, FSM 202 includes two control logic loops. One loop, which may be referred to as an automatic gain control loop, receives signal 210 and outputs a gain control signal to variable gain amplifier 102. The other loop, also referred to as the boost loop, receives signal 212 and outputs a gain control signal to equalizer peaking amplifier 104. In some embodiments, signals 210 and 212 are digital signals, either 1 or 0. Signal 210, which is the input to the AGC loop, is 1 if the signal from peak detector 206 is greater than the signal from reference generator 204, and 0 if the signal from peak detector 206 is less than the signal from reference generator 204. Similarly, signal 212, which is the input signal for the boost loop, is 1 if the regulated signal from regulated amplifier 106 is greater than the regulated signal from equalizer peaking amplifier 104 and 0 if the regulated signal from equalizer peaking amplifier 104 is greater than the regulated signal from regulated amplifier 106.

The control algorithm for the AGC loop and the Boost loop are substantially the same. In some embodiments, the algorithm executed by FSM 202 includes AGC and Boost initial gains and the two loops working in sequence. In some embodiments, the two loops operate simultaneously. FIG. 6C illustrates the AGC loop and the Boost loop working in sequence. FIG. 7C illustrates the AGC loop and the Boost loop working simultaneously. FSM 202 may include a processor that executes code to perform the control algorithm. Alternatively, FSM 202 may include hardware that performs the steps of the control algorithm.

FIG. 5A illustrates an embodiment of a control algorithm 500 that can be executed by FSM 202. Control algorithm 500 can represent either the AGC loop or the Boost loop of FSM 202. As shown in FIG. 5A, control algorithm 500 begins at start 502. In start 502 the loop is initialized by loading an initial gain value and setting a cycle number to zero. Control algorithm 500 then proceeds to step 504 where the input signal (signal 210 or signal 212) is sampled. In some embodiments, step 504 is performed every clock cycle so that an input signal is sampled every clock cycle. In step 506, if the input signal is 1, algorithm 500 proceeds to step 508. If the input signal is 0, algorithm 500 proceeds to step 510.

In step 508, the algorithm 500 determines if the gain signal is saturated at a high level. If not, then algorithm 500 proceeds to step 512 where the gain signal is incremented by 1. If step 508 determines that the gain is saturated, then algorithm 500 proceeds to step 514 where the gain is not changed.

In step 510, algorithm 500 determines if the gain is saturated at a low level. If not, then algorithm 500 proceeds to step 518 where the gain is decremented by 1. If the gain is saturated, the algorithm 500 proceeds to step 516 where the gain is not changed.

From steps 512, 514, 516, or 518, algorithm proceeds to step 520. In step 520, algorithm 500 makes a loop lock condition judgment. Algorithm 500 saves previous values of the input signal (for example the last six values—last continuous five values and the current value). In some embodiments, if six values are kept, and the last six values are equal to "101010" or "010101" or "100110" or "100101" or "101001" or "011001" or "011010" or "010110" and the current cycle number, which is incremented on each clock cycle, is larger than a set value (for example 12, but any number can be used) then the loop lock condition is considered to be met.

FIG. 5B illustrates the loop lock condition. As shown in FIG. 5B, if the gain remains in a small range (e.g., from g−1 to g+1, where g is a constant) in a multiple of clock cycles, for example six clock cycles, then the loop has converged. If the condition occurs after a larger number of clock cycles, for example 12 clock cycles, then the loop lock may be more reliable. Therefore, in loop 520, algorithm 500 checks for the loop lock condition described above and that the number of cycles has exceed a minimum number before declaring the condition.

If, in step 520, algorithm 500 determines that the loop lock condition is satisfied, then algorithm 520 proceeds to end equalization 524. In step 524, an external host may be notified that equalization has ended. The gain is set at its current value for the duration of operation, or until the external host restarts the equalization by returning loop algorithm 500 to start 502.

If, in step 520, algorithm 500 determines that the loop lock condition is not satisfied, then algorithm 500 proceeds to step 522. In step 522, if the cycle number has exceed a maximum number, for example 31 cycles, then algorithm 500 "times out" and proceeds to end equalization 524. Otherwise, algorithm 522 returns to step 504 to sample another input signal.

In this fashion, loop algorithm 500 quickly cycles and locks onto a gain value. Gain high or low saturation occurs because the gain is a quantized code. Saturation occurs to prevent the gain code from overflow or underflow conditions. When the host starts the adaptive equalization of loop algorithm 500 depends on which application field is utilizing the equalization. For example, a USB3.0 host starts algorithm 500 when a super-speed signal (5 Gbps signal) is detected. Generally, the first super-speed signal will be training symbols transmitted directly after link initialization. If the USB 3.0 device is removed and re-connected, the host will restart loop algorithm 500.

In general, FSM 202 may include any number of loops such as loop algorithm 500. As shown in FIG. 2, there are the AGC loop providing a gain signal to variable gain amplifier 102 and a boost loop providing a gain signal to equalizer peaking amplifier 104.

Figure 6A:
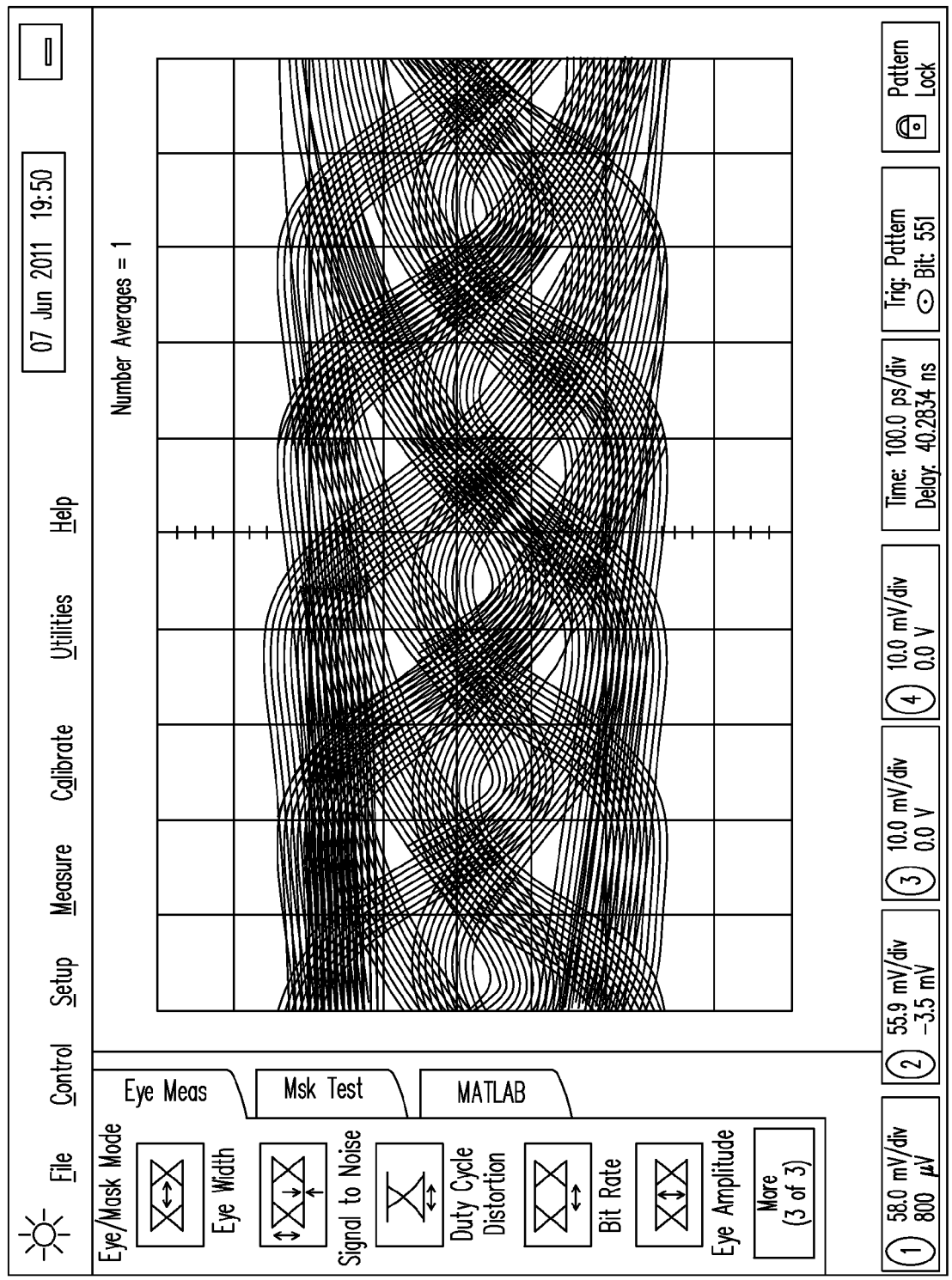
FIGS. 6A, 6B, and 6C illustrate an example of operation of a receiver as is illustrated in FIG. 2.
Figure 6B:
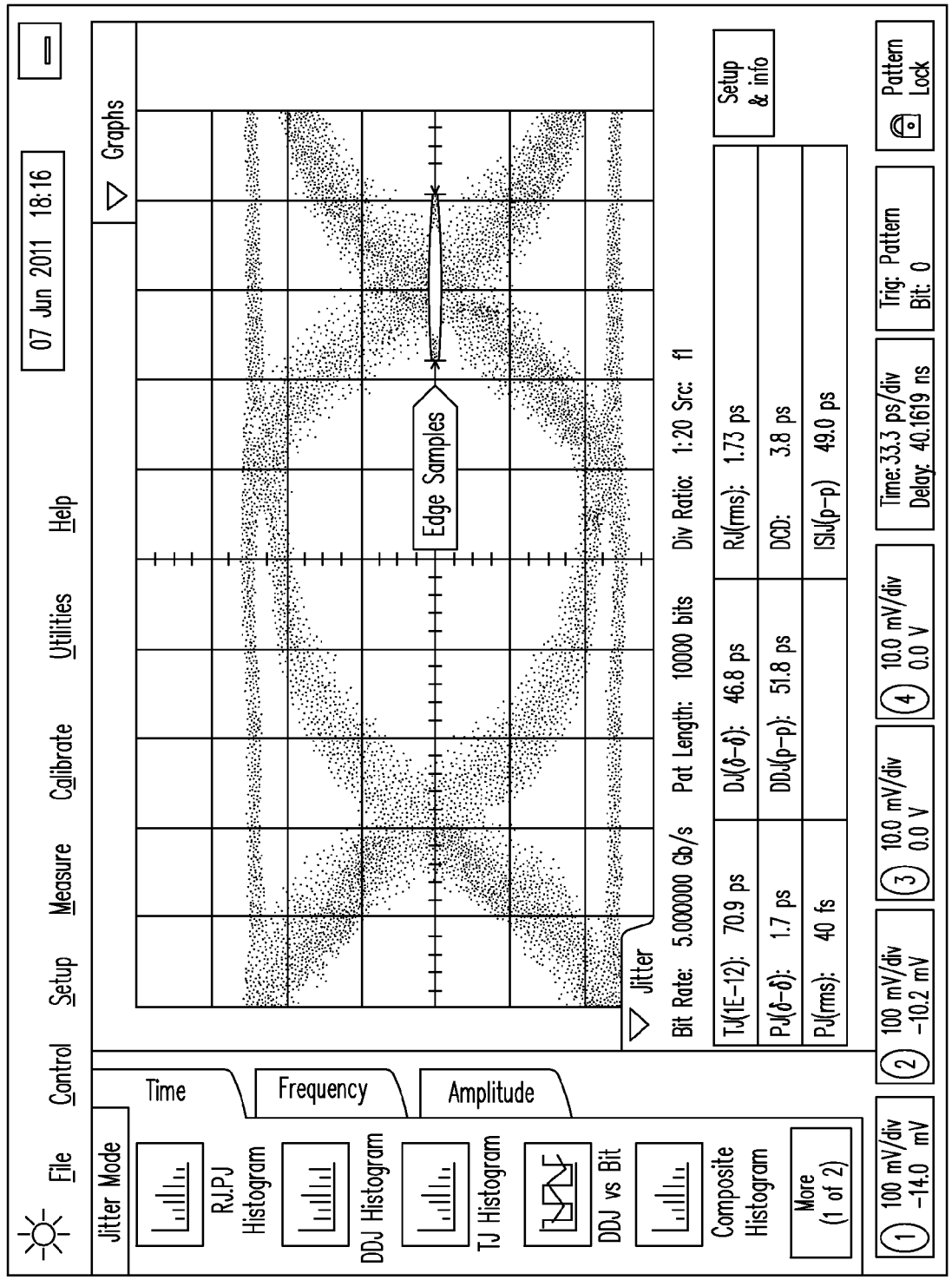
Figure 6C:
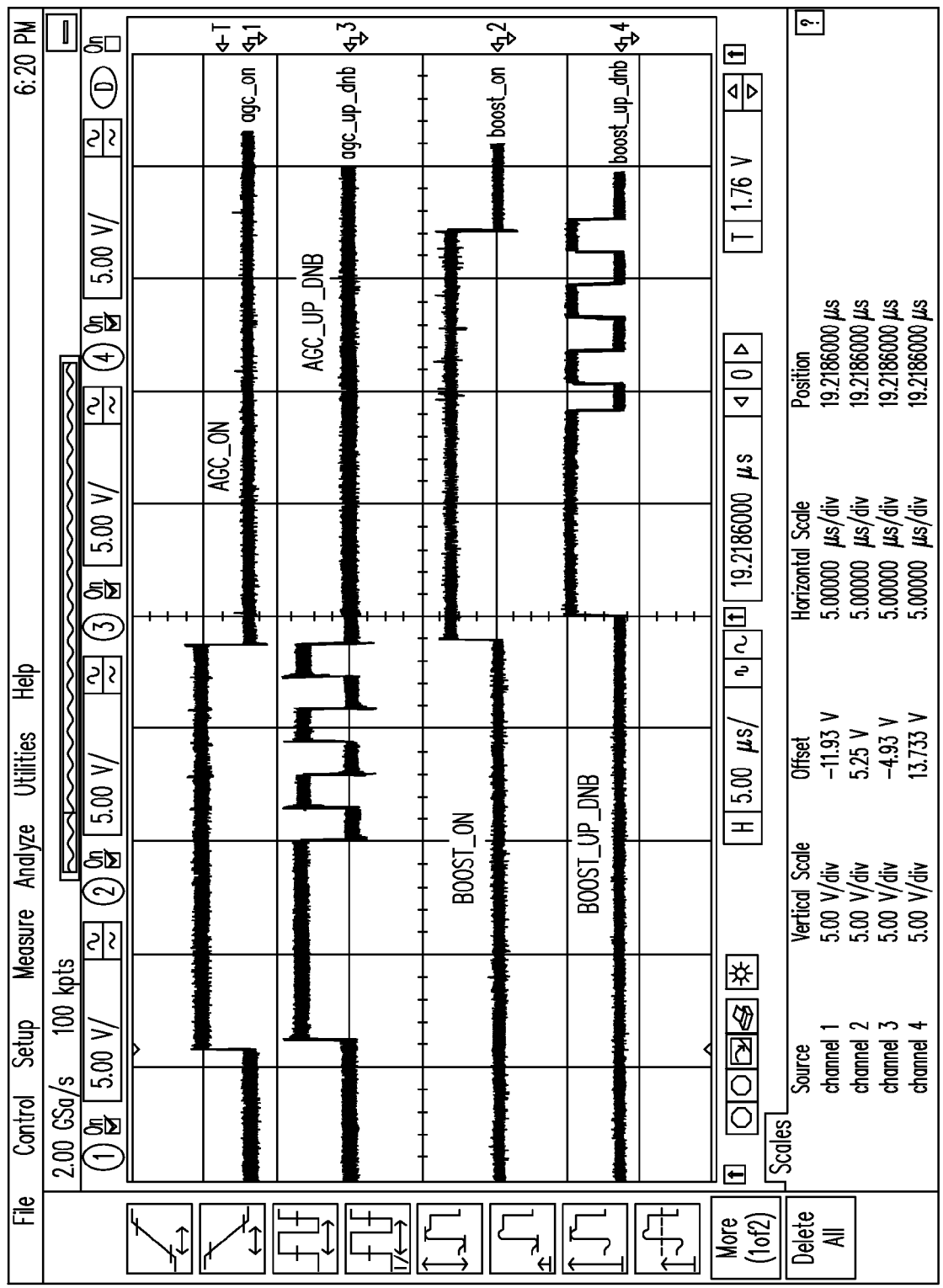

FIGS. 6A, 6B, and 6C illustrate an example of operation of some embodiments of receiver 100 according to the present invention. FIG. 6A illustrates an eye diagram of a data input signal to receiver 100. FIG. 6B illustrates an eye diagram of a data output signal from receiver 100. As can be seen in FIG. 6B, much of the intersymbol interference has been removed from the data signal. FIG. 6C illustrates operation of error signals 210 and 212. As illustrated in FIG. 5C, the automatic gain control (AGC) can be on or off. When AGC is on, signal 210 provides up or down control signals to FSM 202. Further, Automatic peaking boost control can be on or off. When boost is on, signal 212 provides up or down control signals to FSM 202.

Figure 7A:
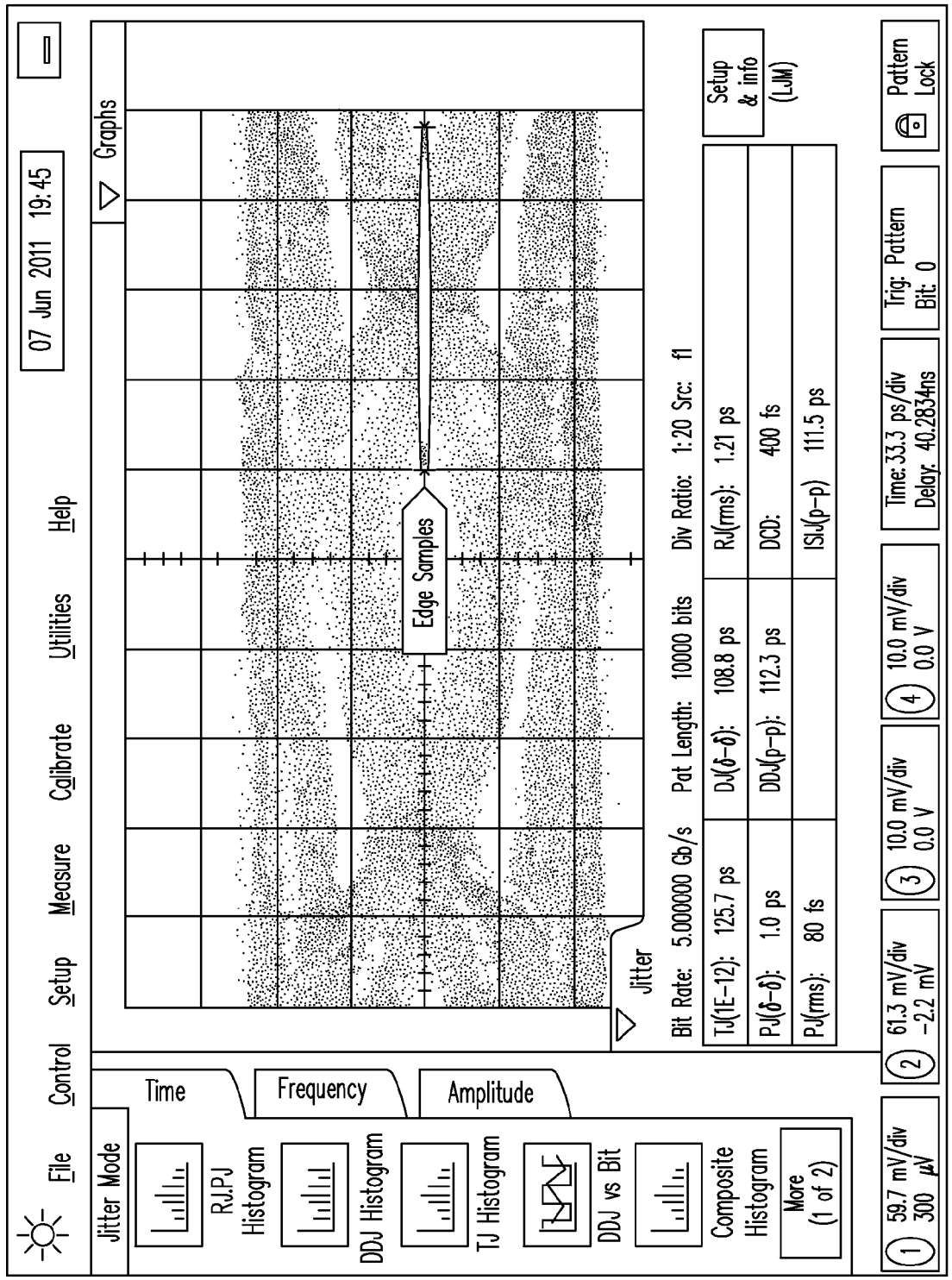
FIGS. 7A, 7B, and 7C illustrate another example of operation of a receiver as is illustrated in FIG. 2.
Figure 7B:
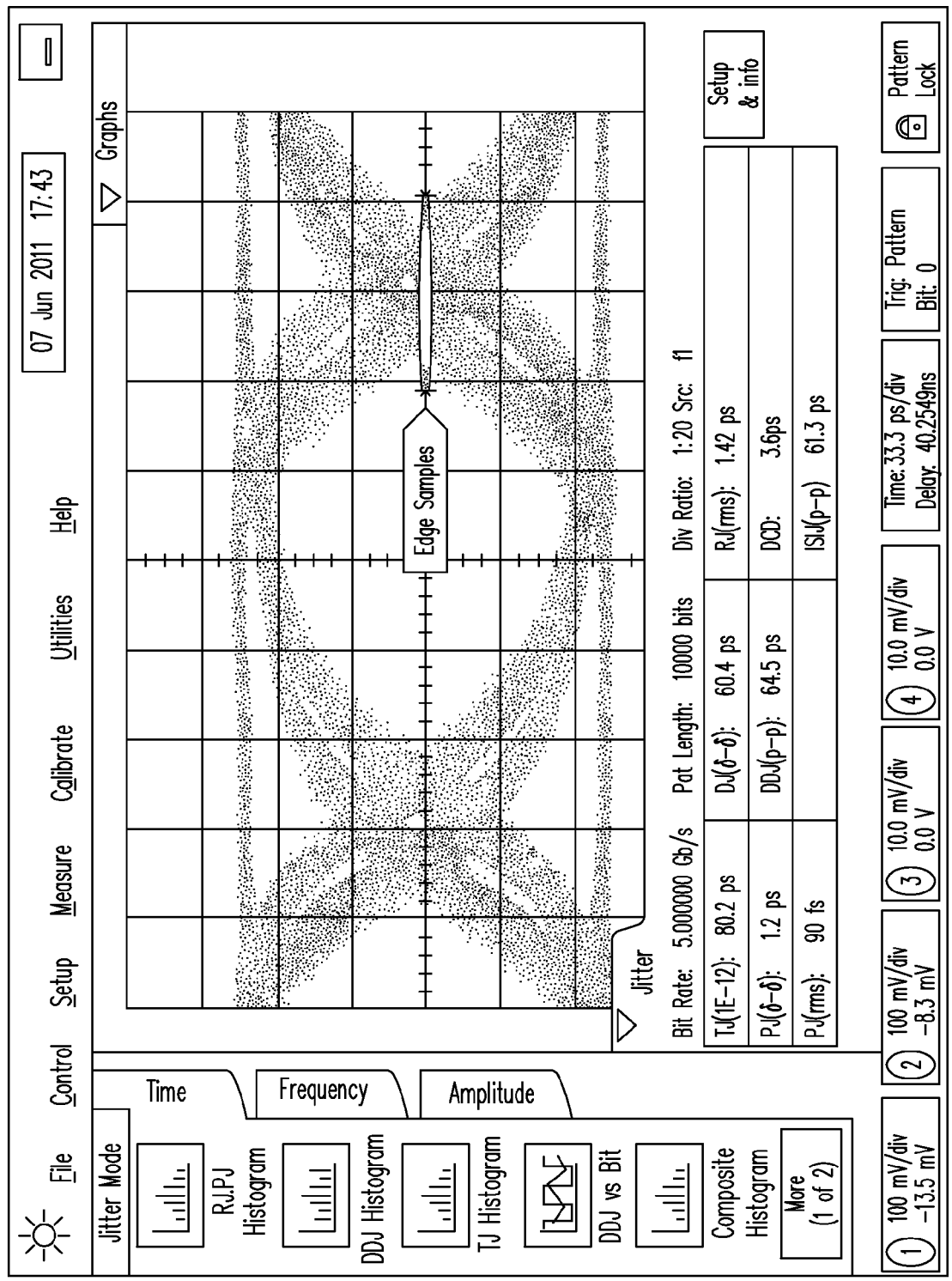
Figure 7C:
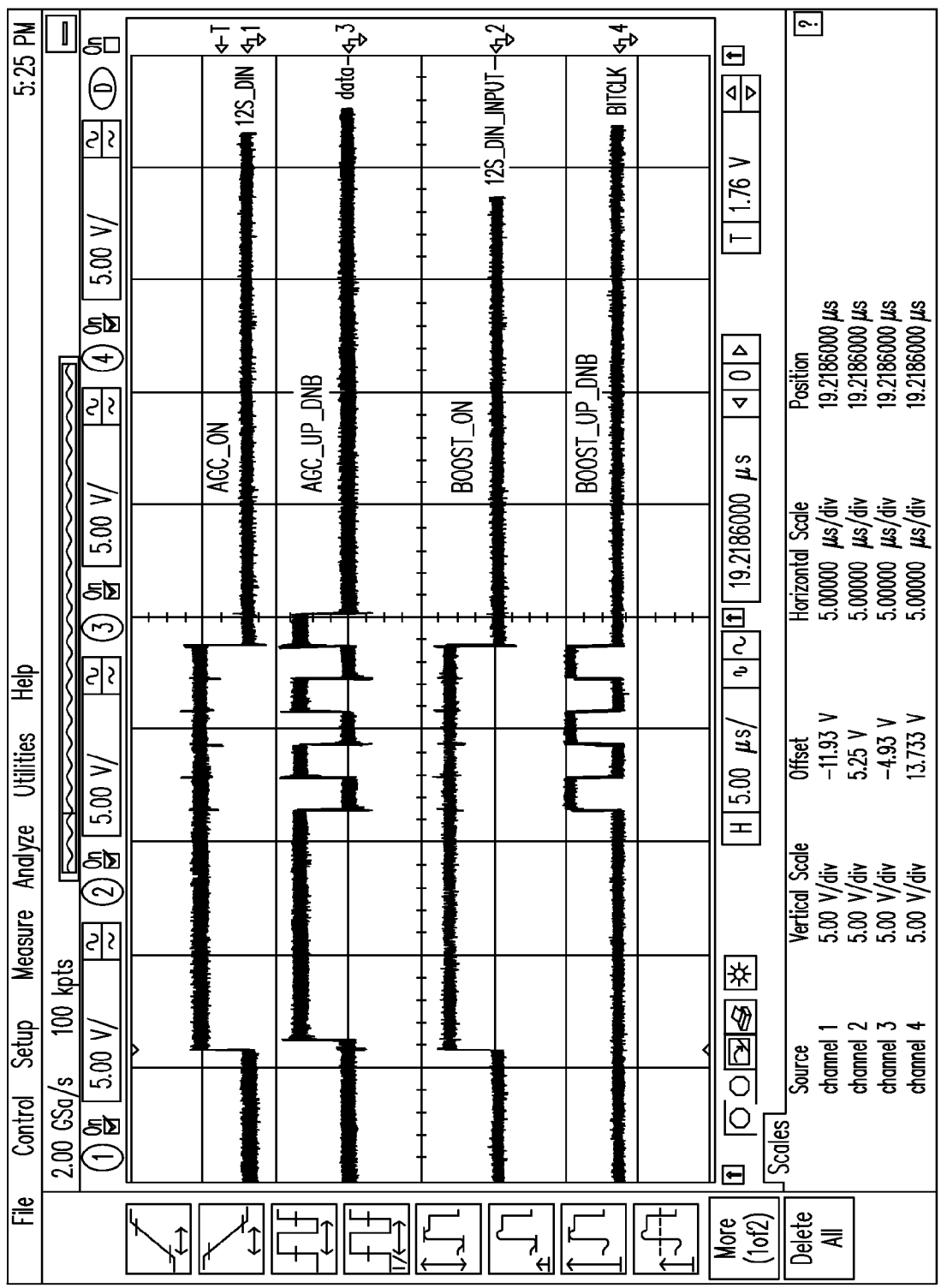

FIGS. 7A, 7B, and 7C illustrate another example of operation of some embodiments of receiver 100 according to the present invention. FIG. 7A illustrates an eye diagram of a data input signal to receiver 100. FIG. 7B illustrates an eye diagram of a data output signal from receiver 100. As can be seen in FIG. 7B, much of the intersymbol interference has been removed from the data signal. FIG. 7C illustrates operation of error signals 210 and 212. As illustrated in FIG. 7C, the automatic gain control (AGC) can be on or off. When AGC is on, signal 210 provides up or down control signals to FSM 202. Further, Automatic peaking boost control can be on or off. When boost is on, signal 212 provides up or down control signals to FSM 202.

In the detailed description above, specific details have been set forth describing certain embodiments. It will be apparent, however, to one skilled in the art that the disclosed embodiments may be practiced without some or all of these specific details. The specific embodiments presented are meant to be illustrative, but not limiting. One skilled in the art may realize other material that, although not specifically described herein, is still within the scope and spirit of this disclosure.

What is claimed is:

1. A receiver comprising:
   a variable gain amplifier;
   an equalizer peaking amplifier coupled serially with the variable gain amplifier;
   a regulated amplifier coupled serially with the variable gain amplifier and the equalizer peaking amplifier, the regulated amplifier providing an output that has a swing value matched to a reference voltage; and
   an adaptation block coupled to the variable gain amplifier, the equalizer peaking amplifier, and the regulated amplifier, the adaptation block including a digital finite state machine that provides a first gain signal to the variable gain amplifier and a second gain signal to the equalizer peaking amplifier, the first gain signal being determined based in part on the reference voltage;
   wherein:
      the digital finite state machine ends adaptation and locks the regulated amplifier and the equalizer peaking amplifier when a lock condition is satisfied, the lock condition being satisfied when the first gain signal and the second gain signal each remain within a defined range over a select number of cycles;
      the digital finite state machine executes an automatic gain loop algorithm to provide the first gain signal and a boost loop algorithm to provide the second gain signal;
      the automatic gain loop algorithm is provided with an input signal having a first digital value when a peak value at an input to the regulated amplifier is greater than the reference voltage and a second digital value when the peak value is less than the reference voltage;
      the boost loop algorithm is provided with an input signal having the first digital value when a rectified input to the regulated amplifier is less than a rectified output of the regulated amplifier and the second digital value when the rectified input is greater than the rectified output; and
      the automatic gain loop algorithm and the boost loop algorithm each include the steps of:
         starting the loop by initializing a gain value and setting a cycle number to 0; sampling the respective input signal of the loop algorithm;
         if the input signal is the first digital value, and the gain value is not saturated, incrementing the gain value;
         if the input signal is the first digital value, and the gain value is saturated, retaining the gain value;
         if the input signal is the second digital value, and the gain value is not saturated, decrementing the gain value;
         if the input signal is the second digital value, and the gain value is saturated, decrementing the gain value;
         determining whether a look loop condition is satisfied;
         if the lock loop condition is satisfied, end adjustment of the equalization;
         if the lock loop condition is not satisfied, determining whether a time-out condition is satisfied,
         if the time-out condition is satisfied, end equalization; and
         if the time-out condition is not satisfied, increment the cycle number and return to sample input signal.

2. The receiver of claim 1, wherein the adaption block further includes:
   a reference generator that generates the reference voltage;
   a peak detector coupled to provide the peak value at the input to the regulated amplifier; and
   a comparator coupled to receive the reference voltage and the peak value, the comparator providing the input signal to the automatic gain loop algorithm.

3. The receiver of claim 2, wherein the adaption block further includes:
   a first power rectifier receiving the input to the regulated amplifier;
   a second power rectifier receiving an output from the regulated amplifier; and
   a comparator coupled to the first power rectifier and the second power rectifier, the comparator providing the input signal to the boost loop algorithm.

4. The system of claim 1, wherein the digital finite state machine receives a first differential signal generated by comparing signals from a reference generator and a peak detector, the first differential signal being used by the digital finite state machine to determine a gain control signal, the gain control signal being sent to the variable gain amplifier.

5. The system of claim 4, wherein the digital finite state machine receives a second differential signal generated by comparing a first signal from a first power rectifier, the first power rectifier coupled to receive the output of the equalizer peaking amplifier, and a second signal from a second power rectifier, the second power rectifier coupled to receive the output of the regulated amplifier, the second differential signal being used by the digital finite state machine to determine a peaking control signal, the peaking control signal being sent to the equalizer peaking amplifier.

6. The system of claim 5, wherein the reference voltage is coupled to the regulated amplifier and the reference generator.

7. The system of claim 1, wherein the adaptation block is shut off when the input signal is properly equalized.

8. The system of claim 7, wherein the gain control signal and peaking control signal are maintained when the adaptation block is shut off.

9. The receiver of claim 1, wherein the lock condition is satisfied if saved adjustments to the voltage gain amplifier and the equalizer peaking amplifier are within a range of adjustments over a set number of cycles or if a maximum number of cycles is exceeded.

10. The receiver of claim 1, wherein the adaptation block is configured to match an eye height of the input signal to the reference signal by controlling the gain of the voltage gain amplifier.

11. A method for conditioning transmissions in a high-speed wireline communications system to reduce intersymbol interference, the method comprising:

receiving an input signal that contains intersymbol interference;

providing a reference voltage;

controlling a voltage gain amplifier with a digital finite state machine, the digital finite state machine controlling the voltage gain amplifier by providing a first gain signal based in part on the reference voltage, and the voltage gain amplifier modifying the input signal; and controlling an equalizer peaking amplifier with a digital finite state machine, the digital finite state machine controlling the equalizer peaking amplifier by providing a second gain signal based in part on the reference voltage, the equalizer peaking amplifier modifying the input signal; and controlling a regulated amplifier with the reference voltage, the regulated amplifier providing an output that has a swing value matched to a reference voltage;

wherein:

controlling the voltage gain amplifier and controlling the equalizer peaking amplifier are performed to equalize the input signal;

the digital finite state machine locks control of the voltage gain amplifier and the equalizer peaking amplifier when a lock condition is achieved, the lock condition being satisfied when the first gain signal and the second gain signal each remain within a defined range over a select number of cycles the digital finite state machine executes an automatic gain loop algorithm to provide the first gain signal and a boost loop algorithm to provide the second gain signal;

the automatic gain loop algorithm is provided with an input signal having a first digital value when a peak value at an input to the regulated amplifier is greater than the reference voltage and a second digital value when the peak value is less than the reference voltage;

the boost loop algorithm is provided with an input signal having the first digital value when a rectified input to the regulated amplifier is less than a rectified output of the regulated amplifier and the second digital value when the rectified input is greater than the rectified output; and the automatic gain loop algorithm and the boost loop algorithm each include the steps of:

starting the loop by initializing a gain value and setting a cycle number to 0; sampling the respective input signal of the loop algorithm;

if the input signal is the first digital value, and the gain value is not saturated, incrementing the gain value;

if the input signal is the first digital value, and the gain value is saturated, retaining the gain value;

if the input signal is the second digital value, and the gain value is not saturated, decrementing the gain value;

if the input signal is the second digital value, and the gain value is saturated, decrementing the gain value;

determining whether a look loop condition is satisfied;

if the lock loop condition is satisfied, end adjustment of the equalization;

if the lock loop condition is not satisfied, determining whether a time-out condition is satisfied, if the time-out condition is satisfied, end equalization; and if the time-out condition is not satisfied, increment the cycle number and return to sample input signal.

12. The method of claim 11, further comprising matching an eye height of the input signal to a reference signal by controlling the gain of the voltage gain amplifier, the reference signal being generated from the reference voltage.

13. The method of claim 12, wherein matching the eye height of the input signal to the reference signal is accomplished by providing the digital finite state machine with a first differential signal, the first differential signal representing a difference between the eye height of the input signal and a reference signal, the reference signal generated from the reference voltage; and further comprising quantizing the differential signal for use by the digital finite state machine.

14. The method of claim 11, further comprising forming a second differential signal, the second differential signal representing a difference between an output of the equalizer peaking amplifier and an output of a regulated amplifier.

15. The method of claim 11, further comprising quantizing the differential signal for use by the digital finite state machine; and wherein controlling the equalizer peaking amplifier is performed by using the quantized differential signal to generate a peaking control signal and then sending the peaking control signal to the equalizer peaking amplifier.

16. The method of claim 11, wherein controlling the voltage gain amplifier is performed and terminated before controlling the equalizer peaking amplifier.

17. The method of claim 11, wherein controlling the voltage gain amplifier is performed concurrently with controlling the equalizer peaking amplifier.

18. The method of claim 11, wherein the lock condition is satisfied if saved adjustments to the voltage gain amplifier and the equalizer peaking amplifier are within a range of adjustments over a set number of cycles or if a maximum number of cycles is exceeded.

19. A method for conditioning signal transmissions in high-speed wireline communications, the method comprising:

receiving an input signal at an equalization system;

controlling a regulated amplifier to provide an output signal that has a swing value matched to a reference level;

controlling a voltage gain amplifier with a digital finite state machine, the digital finite state machine providing a first gain signal so as to condition the input signal such that an eye height of the input signal matches the reference level;

tuning an equalizer peaking amplifier with the digital finite state machine, the digital finite state machine providing a second gain signal to adjust the power of the input signal after the eye height of the input signal has been matched to the reference level, and locking the voltage gain amplifier and the equalizer peaking amplifier when a lock condition is satisfied, the lock condition being satisfied when the first gain signal and the second gain signal each remain within a defined range over a select number of cycles;

wherein:

the digital finite state machine executes an automatic gain loop algorithm to provide the first gain signal and a boost loop algorithm to provide the second gain signal;

the automatic gain loop algorithm is provided with an input signal having a first digital value when a peak value at an input to the regulated amplifier is greater than the reference voltage and a second digital value when the peak value is less than the reference voltage;

the boost loop algorithm is provided with an input signal having the first digital value when a rectified input to the regulated amplifier is less than a rectified output of the regulated amplifier and the second digital value when the rectified input is greater than the rectified output; and the automatic gain loop algorithm and the boost loop algorithm each include the steps of:
  starting the loop by initializing a gain value and setting a cycle number to 0; sampling the respective input signal of the loop algorithm;
  if the input signal is the first digital value, and the gain value is not saturated, incrementing the gain value;
  if the input signal is the first digital value, and the gain value is saturated, retaining the gain value;
  if the input signal is the second digital value, and the gain value is not saturated, decrementing the gain value;
  if the input signal is the second digital value, and the gain value is saturated, decrementing the gain value;
  determining whether a look loop condition is satisfied;
  if the lock loop condition is satisfied, end adjustment of the equalization;
  if the lock loop condition is not satisfied, determining whether a time-out condition is satisfied,
  if the time-out condition is satisfied, end equalization; and
if the time-out condition is not satisfied, increment the cycle number and return to sample input signal.

20. The method of claim 19, wherein controlling the voltage gain amplifier and tuning the equalizer peaking amplifier are performing using a digital finite state machine.

21. The method of claim 20, further comprising:
  comparing the eye height of the input signal to a reference signal associated with the reference level to provide a gain error signal; and
  comparing an equalized signal produced by the equalizer peaking amplifier with a regulated signal produced by the regulated amplifier to provide a peaking error signal.

22. The method of claim 21 further comprising
  quantizing the gain error signal and the peaking error signal;
  transmitting the quantized gain error signal and the quantized peaking error signal to the digital finite state machine;
  creating a gain control signal from the quantized gain error signal and a peaking control signal from the quantized peaking error signal;
  transmitting the gain control signal from the digital finite state machine to the voltage gain amplifier; and
  transmitting the peaking control signal from the digital finite state machine to the equalizer peaking amplifier.

23. The method of claim 19, wherein the lock condition is satisfied if saved adjustments to the voltage gain amplifier and the equalizer peaking amplifier are within a range of adjustments over a set number of cycles or if a maximum number of cycles is exceeded.

* * * * *